(12) United States Patent
Song et al.

(10) Patent No.: US 7,829,897 B2
(45) Date of Patent: Nov. 9, 2010

(54) ARRAY SUBSTRATE OF LIQUID CRYSTAL DISPLAY DEVICE HAVING THIN FILM TRANSISTOR ON COLOR FILTER AND METHOD OF FABRICATING THE SAME

(75) Inventors: Jean-Ho Song, Seoul (KR); Chong-Chul Chai, Seoul (KR); Jin-Ho Ju, Seoul (KR); Joo-Ae Youn, Seongnam-si (KR); Jun-Hyung Souk, Yongin-si (KR); Min Kang, Seoul (KR)

(73) Assignee: Samsung Electronics Co, Ltd., Suwon-Si (KR)

( * ) Notice: Subject to any disclaimer, the term of this patent is extended or adjusted under 35 U.S.C. 154(b) by 7 days.

(21) Appl. No.: 12/428,782

(22) Filed: Apr. 23, 2009

(65) Prior Publication Data

US 2009/0278132 A1 Nov. 12, 2009

(51) Int. Cl.
*H01L 33/00* (2010.01)
(52) U.S. Cl. .................. 257/72; 257/98; 257/E29.273; 257/E21.411; 438/29
(58) Field of Classification Search .................. 257/72, 257/98, E29.273, E21.411; 438/29
See application file for complete search history.

(56) References Cited

U.S. PATENT DOCUMENTS

| 6,407,782 | B1 | 6/2002 | Kim |
| 7,312,840 | B1* | 12/2007 | Sakamoto .................. 349/106 |
| 2004/0109110 | A1 | 6/2004 | Kim et al. |
| 2004/0263722 | A1* | 12/2004 | Oh et al. ..................... 349/106 |
| 2006/0061711 | A1* | 3/2006 | Lee et al. .................... 349/106 |
| 2008/0113461 | A1* | 5/2008 | Tung et al. ................... 438/30 |

FOREIGN PATENT DOCUMENTS

KR 1020040061950 7/2004

* cited by examiner

*Primary Examiner*—Trung Dang
(74) *Attorney, Agent, or Firm*—F. Chau & Associates, LLC

(57) ABSTRACT

An array substrate of a liquid crystal display device having a color filter on a gate metal layer, and a data metal layer formed on the color filter. First a gate insulating layer is formed on the gate metal layer to protect and a second gate insulating layer is formed on the color filter layer. Gate lines and gate electrodes are formed in direct contact with the substrate, and color filters are formed on the gate electrodes. To protect gate lines in the patterning process of color filters, a first gate insulating layer is formed on the gate lines and electrodes. Therefore, a high aperture ratio may be enhanced, and the manufacturing yield may be increased.

21 Claims, 6 Drawing Sheets

ARRAY SUBSTRATE OF LIQUID CRYSTAL DISPLAY DEVICE HAVING THIN FILM TRANSISTOR ON COLOR FILTER AND METHOD OF FABRICATING THE SAME

CROSS-REFERENCE TO RELATED APPLICATION

This application claims priority under 35 U.S.C. §119 to Korean Patent Application No. 2008-43299, filed on May 9, 2008, the contents of which are herein incorporated by reference in their entirety.

BACKGROUND OF THE INVENTION

1. Technical Field

The present disclosure relates to a liquid crystal display device, and more particularly, to a thin film transistor array substrate of a liquid crystal display device having color filters and a method of fabricating the same.

2. Discussion of the Related Art

Since flat panel display devices are thin and light, and have low power consumption, the flat panel display devices are used for portable display devices. Among the flat panel display devices, liquid crystal display (LCD) devices are used for laptop computers, desktop computer monitors, and televisions.

The LCD devices include a first substrate having color filters and a second substrate having switching elements and pixel electrodes. The first substrate and the second substrate are spaced apart and face each other. A liquid crystal material is interposed therebetween. On the first substrate, a black matrix and a color filter layer are formed in an array matrix including a plurality of red, green, and blue color filters surrounded by corresponding portions of the black matrix. A common electrode is formed on the first substrate and covers the color filter layer and black matrix. On the second substrate, a plurality of thin film transistors is formed in a shape of an array matrix corresponding to the color filter layer. A plurality of gate lines and data lines cross one another such that each thin film transistor (TFT) is located adjacent to each intersection of the gate lines and the data lines. A plurality of pixel electrodes are formed on a pixel region. The pixel electrode is formed of a transparent conductive material having high transmissivity, such as indium-tin-oxide (ITO) or indium-zinc-oxide (IZO). The liquid crystal molecules of the liquid crystal material layer are aligned and arranged by the operation of the thin film transistor. An incident light passing through the liquid crystal layer is controlled to display an image.

When fabricating the LCD device, the first substrate is aligned with and attached to the second substrate. The first substrate and second substrate are assembled after being formed separately. During the separate forming processes, the first substrate is treated with heat processes such as, for example, a pre-bake process, exposure to light, or a post-bake process for forming color filters. The heat processes may result in deformation of the elements of the first substrate, which causes misalignment when assembling the first and second substrates.

When the first substrate is misaligned with respect to the second substrate, then a light leakage occurs in the completed LCD device. For example, on the first substrate, the black matrix is formed on the entire surface of the first substrate and has openings corresponding to the pixel electrode of the second substrate. The black matrix prevents light leakage in the LCD panel except for the openings corresponding to the pixel electrode. The black matrix protects the thin film transistor from the light such that the black matrix prevents generation of a photo-current in the channel area of the thin film transistor. The black matrix needs an enough alignment margin to prevent light leakage. When there are errors in the alignment margin of the black matrix, the light leakage occurs, thereby deteriorating display quality of the LCD devices.

A color filter layer can be formed in the array substrate to reduce the misalignment. However, a short circuit between the gate metal layer and the data metal layer, and a high parasitic capacitance between the gate metal layer and the data metal layer may still occur. The parasitic capacitance causes cross talk.

SUMMARY OF THE INVENTION

One embodiment of the invention is directed to an array substrate of a liquid crystal display device having a color filter on a gate metal layer, and a data metal layer formed on the color filter. First a gate insulating layer is formed on the gate metal layer to protect and a second gate insulating layer is formed on the color filter layer. In this present embodiment of the invention, gate lines and gate electrodes are formed in direct contact with the substrate, and color filters are formed on the gate electrodes. To protect gate lines in the patterning process of color filters, a first gate insulating layer is formed on the gate lines and electrodes. The present embodiment of the invention substantially obviates one or more of the problems and/or disadvantages of the related art. This embodiment of the invention is advantageous to achieve a high aperture ratio, simplify the manufacturing process and increase the manufacturing yield.

Another embodiment of the invention is directed to an array substrate of a liquid crystal display device having a color filter on the gate metal layer, and the data metal layer formed on the color filter. First a gate insulating layer is formed on the gate metal layer to protect, and a second gate insulating layer is formed on the color filter layer. The data metal layer includes thick data lines, and source-drain electrodes. As the size of the display panel increase, a signal delay becomes a critical problem in the display quality. To solve the signal delay problem, resistance of the metal line has to be reduced. There are two ways to reduce resistance. The first way is to make the metal line wider. The second way is to make the metal line thicker. In case of the first solution, it has a bad effect in terms of a high aperture ratio. So the second method is a better way to get a low resistance. In this embodiment of the invention, the data metal layer is thick enough to reduce the signal delay problem. Appropriate thickness of the data metal layer will be disclosed in the detailed description of embodiments.

Another embodiment of the invention is directed to a thin film transistor array substrate including a black matrix formed on a portion of the substrate corresponding to a channel area. In this embodiment of the invention, gate lines and gate electrodes are formed in direct contact with the substrate, and color filters are formed on the gate electrode. To protect the gate metal layer in the patterning process of color filters, the first gate insulating layer is formed on the gate metal layer. The basic thin film transistor and color filter structure may be the same as the first embodiment of the present invention or the second embodiment of the present invention. By forming the black matrix on the thin film transistor array substrate, problems caused by misalignment can be reduced.

Another embodiment of the present invention is directed to a method of fabricating an array substrate of a liquid crystal display device having a color filter on a gate metal layer, and a data metal layer formed on the color filter. A first gate insulating layer is formed on the gate metal layer to protect the gate metal layer before forming the color filter. A second gate insulating layer is formed on the color filter layer to protect channel area. In this embodiment of the invention, gate lines and electrodes for the thin film transistor are formed on the substrate directly, and the color filter layer is formed on the gate lines, and electrodes. The data lines, and drain electrodes are formed after forming the color filter layer on the gate lines, and electrodes. Because of the color filter pattern between the gate metal layer including gate lines and gate electrodes and data metal layer including data lines, and drain electrodes, the vertical distance between the gate metal layer and the data metal layer is great enough to reduce the bad effect of parasitic capacitance between them. The first gate insulating layer is formed on the gate lines, and electrodes to protect them. The second gate insulating layer is formed after forming the color filter layer on the gate insulating layer. The second gate insulating layer protects the color filter layers.

Another embodiment of the invention is directed to a liquid crystal display device that includes one of the thin film transistor substrates according to one of the embodiments of the present invention and a substrate facing the thin film transistor substrate and having a common electrode. A liquid crystal layer is formed therebetween. In this present embodiment of the invention, gate lines and gate electrodes are formed in direct contact with a substrate. The color filters are formed on the gate electrode. To protect gate lines in the patterning process of the color filters, a first gate insulating layer is formed on the gate lines and electrodes. The present embodiment of the invention is advantageous to achieve a high aperture ratio, minimize a parasitic capacitance between the gate metal layer and the data metal layer, and to simplify the manufacturing process and increase the manufacturing yield.

It is to be understood that both the foregoing description and the following detailed description are exemplary and explanatory and are not intended to be limited to only the examples described in this application.

BRIEF DESCRIPTION OF THE DRAWINGS

Exemplary embodiments of the present invention can be understood in more detail from the following descriptions taken in conjunction with the accompanying drawings in which.

DETAILED DESCRIPTION OF EXEMPLARY EMBODIMENTS

The invention is described more fully hereinafter with reference to the accompanying drawings, in which embodiments of the invention are shown. This invention may, however, be embodied in many different forms and should not be construed as limited to the embodiments set forth herein.

Figure 1:
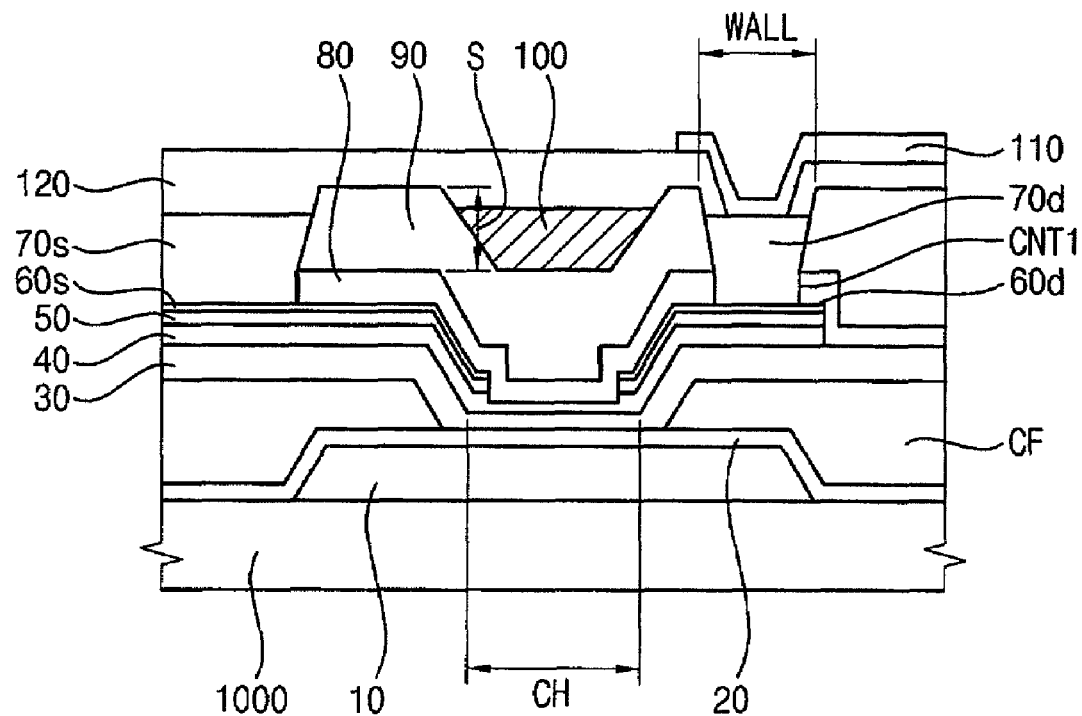
FIG. 1 is a sectional view of a substrate according to an exemplary embodiment of the present invention.

FIG. 1 is a cross sectional view of a Thin Film Transistor (TFT) of a substrate according to an exemplary embodiment of the present invention. Referring to FIG. 1, a gate metal layer is formed on a glass substrate 1000. The gate metal is deposited on the glass substrate 1000 and patterned to form gate lines, gate electrodes 10, and gate pads. The gate electrode 10 is formed by extending the gate lines. The gate metal layer may comprise, for example, copper, molybdenum, nickel, aluminum, chrome, tungsten or an alloy thereof. A thickness of the gate line and gate electrode can be more than about 2 μm. As the thickness of the gate lines and gate electrodes 10 increases, the cross section increases. The resistance of the gate lines and gate electrodes 10 is inversely proportional to the cross section. Due to the increase of the cross section, the resistance of the gate lines and gate electrodes 10 decreases.

A first gate insulating layer 20 is formed on the gate lines, the gate electrodes 10, and the gate pads. The gate electrode 10 is formed by extending the gate lines. The first gate insulating layer 20 protects the gate lines, the gate electrodes 10, and the gate pads from contamination by a developing solution used to form a color filter CF pattern. During a process of patterning the color filter CF, the developing solution may contaminate the gate metal layer. To form a color filter layer, at least three different types of colors are used. To form the color filter CF pattern with these color filters, the developing solution is used after a photo exposure process. Because the gate metal layer is exposed to the developing solution without any protection material in the process of patterning the color filter layer, the developing solution contacts the gate metal layer directly. When contaminated by the developing solution, the gate metal layer loses uniformity and an open circuit at the gate metal layer may occur. In an exemplary embodiment, a thin film transistor substrate includes the first gate insulating layer 20 to protect the first metal layer from contamination. A thickness of the first gate insulating layer 20 may range from about 500 Å to about 4000 Å. Due to the color filter pattern, a possibility of a short circuit with the data metal layer is low. In an exemplary embodiment, a thickness of the first gate insulating layer 20 may be thinner than a second gate insulating layer 30.

The color filter CF including red, green and blue color, is formed on the first insulating layer 20. When the color filter CF is formed on the gate metal layer, the parasitic capacitance between elements such as the gate line, the gate electrode and the data line, the source, and drain electrode is decreased. Because a thickness of the color filter CF is at least more than about 2 μm, the distance to minimize the parasitic capacitance between the gate metal layer and the data metal layer can be obtained in an exemplary embodiment of the present invention. Capacitance is inversely proportional to the distance between electrodes. As the distance between the gate electrode and the source electrode or the distance between the gate electrode and the drain electrode increases, the parasitic capacitance between the gate electrode and source electrode or the gate electrode and the drain electrode is decreased. The decrease of parasitic capacitance can prevent a flickering phenomenon. In a conventional art, a color filter is formed after forming data lines and drain electrodes, or a color filter layer is formed on the substrate facing the thin film transistor substrate. In an exemplary embodiment of the present invention, the color filter CF layer is formed between the gate metal layer and the data metal layer. As such, in an exemplary embodiment of the present invention, the parasitic capacitance can be minimized.

The second gate insulating layer 30 is formed on the color filter CF. The second gate insulating layer 30 protects a channel area CH and the liquid crystal from contamination by the color filter CF. If the color filter CF is formed without any capping material, the color filter CF may contact the amorphous silicon layer 40 or the liquid crystal directly. In this case, an organic material of the color filter CF contaminates the liquid crystal due to an out-gassing. This contamination deteriorates optical characteristics of the liquid crystal. When the color filter C/F is formed between the first gate insulating layer 20 and the second gate insulating layer 30, the liquid crystal is protected from contamination by the color filter CF layer. When the color filter CF is separated from the channel area CH by the second gate insulating layer 30, the color filter CF does not contaminate the channel area CH.

The amorphous silicon layer 40 is formed on the second gate insulating layer 30. The amorphous silicon layer (40) is used to form the channel area CH with the gate electrode 10, a seed metal for source electrode 60s, and a seed metal for drain electrode 60d. An N+ heavily doped layer 50 is formed after forming the amorphous silicon layer 40 for ohmic contact. An ohmic contact is a region on a semiconductor device where the current-voltage (I-V) curve of the device is linear and symmetric. If the I-V characteristic is non-linear and asymmetric, the contact can be referred to as a blocking or Schottky contact. Ohmic contacts on semiconductors can be formed by a sputtering process or an evaporation of metal pads patterned using photolithography. Low-resistance and stable contacts improve the performance and reliability of integrated circuits. The ohmic contacts may be formed using a Chemical Vapor Deposition (CVD) process. Without the N+ heavily doped layer 50, electrical contact characteristics between the amorphous silicon layer 40 and the data metal layer may not be enough to form a transistor. The amorphous silicon layer 40 and N+ heavily doped layer 50 are referred to as a semiconductor pattern.

The amorphous silicon layer 40 can be replaced by, for example, a poly-silicon layer, a micro crystal silicon layer, or an oxide semi-conductor such as Gallium-Indium-Zinc-Oxide (GIZO). After forming a semi-conductor layer, the seed metal layer of the data metal layer is formed thereon. The seed metal layer may be formed by a sputtering process. The seed metal layer enhances an adhesion characteristic of a thick metal layer to the semi-conductor pattern. The seed metal layer can comprise, for example, copper, molybdenum, nickel, aluminum, chrome, tungsten or an alloy thereof. The seed metal layer includes the seed metal for the source electrode 60s and the seed metal for the drain electrode 60d. The thick metal layer includes the thick metal for the source electrode 70s and the thick metal for the drain electrode 70d. A thickness of the amorphous silicon layer 40 ranges from about 1000 Å to about 2500 Å. A thickness of the N+ heavily doped layer ranges from about 200 Å to about 1000 Å.

After forming the semi-conductor pattern, a passivation layer 80 is formed thereon to protect the channel area CH and the semiconductor pattern from the chemical contamination or physical damage. Silicon nitride or silicon oxides are types of the passivation layer 80. The passivation layer 80 has a contact hole to connect the pixel electrode and the drain electrode electrically.

A first organic insulating layer 90 is formed on the passivation layer 80. The first organic insulating layer 90 is used to form a wall WALL to form the thick metal layer. The thick metal layer includes the thick metal for the source electrode 70s and the thick metal for the drain electrode 70d. The first organic insulating layer 90 has a contact hole. The contact hole may be formed with the contact hole CNT1 of the passivation layer 80 in the same process. When forming the first organic insulating layer 90, a space S corresponding to the channel area CH and the data line may be formed to form a room to adopt a black matrix 100 in the same process. A half-tone mask or slit mask may be used to form an organic insulating layer. Using this organic insulating layer, the pixel electrode 110 of a pixel can be enlarged which results in a high aperture ratio. A halftone mask or slit mask is used in a lithography process to reduce the number of steps used in a liquid crystal display (LCD) manufacturing process. For example, three thicknesses of resist films can be produced using the halftone mask. Since the first organic insulating layer 90 decreases the parasitic capacitance between the data lines and the pixel electrode, the pixel electrode can be enlarged more than that of a structure without an organic insulating layer. The first organic insulating layer 90 also makes the TFT substrate flat such that orientation controls of the liquid crystal can be improved.

Through the contact hole CNT1, the seed metal layer is exposed on the portion corresponding to the drain electrode 60d and 70d. The thick metal layer 70 grows from the seed metal layer by, for example, an electroless plating method or an electro plating method. The electroless plating, also known as a chemical or auto-catalytic plating, is a non-galvanic type of plating method that involves several simultaneous reactions in an aqueous solution, which occur without the use of external electrical power. The reaction is accomplished when hydrogen is released by a reducing agent, for example, sodium hypophosphite, and oxidized thus producing a negative charge on a surface of the seed metal layer. Electroplating is a process where a metal in an ionic form is supplied with electrons to form a non-ionic coating on a substrate. Electroplating includes, for example, a chemical solution which contains the ionic form of the metal, an anode (positively charged), e.g., a soluble anode which may comprise the metal being plated or an insoluble anode (e.g., carbon, platinum, titanium, lead, or steel), and a cathode (negatively charged) where electrons are supplied to produce a film of non-ionic metal. If a metal inkjet method is used to form the thick metal layer, the seed metal layer can be omitted in the process of forming the data metal layer.

The black matrix 100 is formed on a portion corresponding and proportional to the channel area CH. The black matrix 100 can be an organic material. The black matrix 100 on the TFT substrate prevents photo current in the channel area CH by blocking light and light leakage. If the black matrix 100 is formed on the TFT substrate, then the upper substrate facing the TFT substrate may not include an additional black matrix according to an exemplary embodiment of the present invention. If the black matrix 100 is omitted on the upper substrate, then a margin of alignment between the TFT substrate and the upper substrate increases such that aperture ratio increases, and the manufacturing process can be simplified.

A second organic insulating layer 120 may be formed on the black matrix 100. If the black matrix 100 is exposed to the liquid crystal, the black matrix 100 may contaminate the liquid crystal. To prevent the contamination due to the black matrix 100, the second organic insulating layer 120 may be formed. The second organic insulating layer 120 can be omitted. When the orientation layer for the liquid crystal can protect the liquid crystal from contamination, the process for forming the second organic insulating layer 120 can be omitted.

A pixel electrode 110 is formed and connected to the drain electrode 70d. Due to the first organic insulating layer 90, the pixel electrode 110 can be enlarged on the pixel boundary. Because the distance between the electrodes 70d, 110 is inversely proportional to the parasitic capacitance, the pixel electrode 110 can be enlarged. An end portion of the pixel electrode 110 may overlap a data line in the pixel boundary area such that the aperture ratio can be enhanced.

Figure 2:
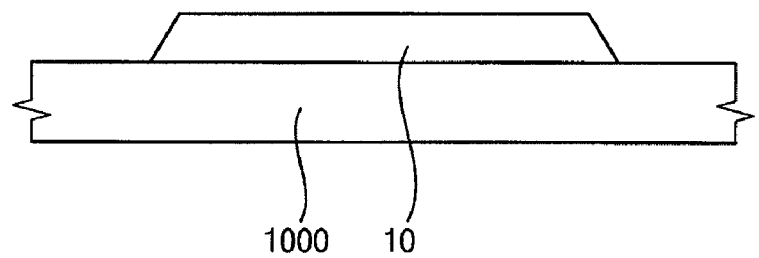
FIG. 2 is a cross sectional view of a first metal layer formed on a substrate according to an exemplary embodiment of the present invention.

FIG. 2 is a sectional view of a TFT of a substrate according to an exemplary embodiment of the present invention. Referring to FIG. 2, a gate metal layer is formed on the substrate 1000. The gate metal layer includes gate lines, the gate electrodes 10, and gate pads. The gate electrode 10 is formed by extending the gate lines. The gate metal layer can comprise, for example, copper, aluminum, molybdenum, nickel or alloys thereof. The thickness of the gate line and gate electrode can be more than about 2 μm. As the thickness of the gate metal layer increases, the resistance of the gate metal layer decreases. When thicknesses of the gate lines and gate electrodes 10 increase, the cross sections of the gate lines and gate electrodes increase. The resistance of the gate lines and gate electrodes 10 is inversely proportional to the cross section. Due to an increase of the cross section, the resistance of the gate lines and gate electrodes 10 can be decreased.

Figure 3:
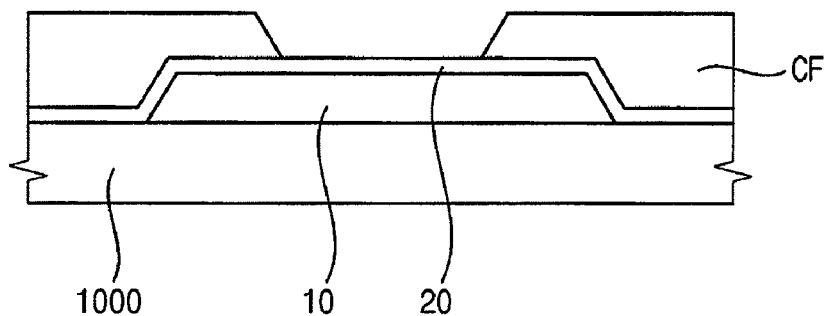
FIG. 3 is a cross sectional view of a first gate insulating layer and a color filter formed on a substrate according to an exemplary embodiment of the present invention.

FIG. 3 is a sectional view of a TFT of a substrate according to an exemplary embodiment of the present invention. On the gate metal layer, the first gate insulating layer 20 is formed. The gate metal layer includes the gate lines, the gate electrodes 10, and gate pads. This first gate insulating layer 20 protects the first gate metal layer, and includes silicon nitride or silicon oxide. In an exemplary embodiment of the present invention, the color filter CF is formed between the gate metal layer including the gate line, the gate electrode, and the gate pad and the data metal layer including the data line, the source-drain electrode, and the data pad. To form color filters of different color, a patterning process is performed. To make a pattern of the color filter CF, a developing solution is used. Without the first insulating layer 20, the developing solution contaminates the gate metal layer including the gate line, the gate electrode 10, and the data pad. This is because the gate metal layer is exposed to the developing solution directly. When the gate metal layer is contaminated, the possibility of an open circuit in the gate line increases, and uniformity of the gate metal layer deteriorates. When the first gate insulating layer 20 is formed on the gate metal layer, then the gate metal layer is protected from contamination by the developing solution used for patterning the color filter. As such, an exemplary embodiment of the present invention includes the first gate insulating layer 20 to protect the first metal layer from contamination by the developing solution. In an exemplary embodiment of the present invention, a thickness of the first gate insulating layer 20 ranges from about 500 Å to about 4000 Å. The color filter pattern can minimize a short circuit with the data metal layer. Thus, a thickness of the first gate insulating layer 20 may be thinner than a thickness of the second gate insulating layer 30.

The color filter CF including red, green and blue color is formed on the first insulating layer 20. When the color filter CF is formed on the gate metal layer including the gate lines, the gate electrodes 10, and gate pads, the parasitic capacitance between elements such as the gate line, gate electrode 10 and data line and source, and drain electrode is decreased. Because the thickness of the color filter CF is more than about 2 μm, the distance between the gate metal layer and the data metal layer is increased. Capacitance is inversely proportional to the distance between electrodes. As the distance between the gate electrode 10 and the source electrode, and between the gate electrode 10 and the drain electrode increase, the parasitic capacitance between the gate electrode 10 and the drain electrode, and between the gate electrode 10 and the source electrode decrease. The decreased parasitic capacitance according to an exemplary embodiment of the present invention prevents a flickering phenomenon. In a conventional art, a color filter is formed after forming data lines and drain electrodes, or the color filter layer is formed on the substrate facing the thin film transistor substrate. However, in an exemplary embodiment of the present invention, the color filter layer CF is formed on the gate metal layer including the gate lines, the gate electrodes 10, and the gate pads before forming the data metal layer.

Figure 4:
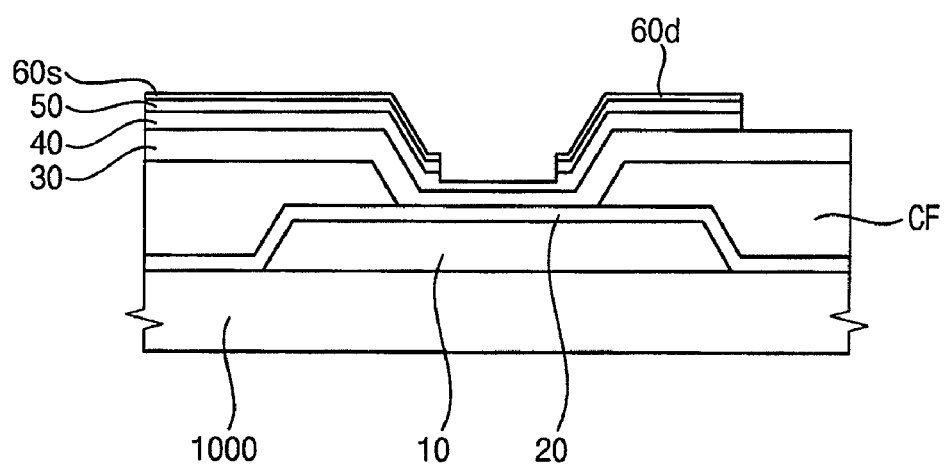
FIG. 4 is a cross sectional view of a semi-conductor pattern and a seed metal layer formed on a substrate according to an exemplary embodiment of the present invention.

FIG. 4 is a sectional view of a TFT of a substrate according to an exemplary embodiment of the present invention. Referring to FIG. 4, the second gate insulating layer 30 is formed on the substrate 1000. On the second gate insulating layer 30, the amorphous silicon layer 40 is formed. On the amorphous silicon layer 40, the N+ heavily doped layer 50 is formed. The second gate insulating layer 30 is formed on the color filter CF. The second gate insulating layer 30 protects the channel area CH and the liquid crystal from contamination by the color filter CF. When the color filter CF is formed without a capping material, the color filter CF may contact the liquid crystal or the semiconductor layer 40 directly. In this case, the material of the color filter contaminates the liquid crystal. This contamination deteriorates optical characteristics of the liquid crystal. When the color filter CF is formed between the first gate insulating layer 20 and second gate insulating layer 30, the liquid crystal is protected from contamination by the color filter CF layer. The color filter CF is separated from the channel area CH by the second gate insulating layer 30 so that the color filter CF does not contaminate the channel area CH.

As such, the second gate insulating layer 30 is used in an exemplary embodiment of the present invention. On a portion corresponding to the channel area CH, the color filter CF is not formed to maintain the channel characteristic. When the distance between the semi-conductor pattern and the gate electrode becomes too large, the proper current characteristic of the thin film transistor is not acquired. As a result, on the portion corresponding to the channel area CH, the first gate insulating layer 20 and the second gate insulating layer 30 contact each other directly to acquire the proper current characteristic according to an exemplary embodiment of the present invention.

The amorphous silicon layer 40 is formed on the second gate insulating layer 30. The amorphous silicon layer 40 is used to form the channel area CH with the gate electrode 10, the source electrode 60s, and the drain electrode 60d.

The N+ heavily doped layer 50 is formed for an ohmic contact between the amorphous silicon layer 40 and the source and drain electrode 60s, 60d. Without the N+ heavily doped layer 50, electrical contact characteristic between the amorphous silicon layer 40 and the data metal layer may not be enough to form a transistor. The amorphous silicon layer 40 and the N+ heavily doped layer 50 are referred to as a semiconductor pattern. On the N+ heavily doped layer 50, a data metal layer is formed. The data metal layer can be a seed layer including the seed metal for the source electrode 60s and the drain electrode 60d. When the metal layer is the seed layer, another metal layer can grow on the seed layer by the electroless plating method or electroplating method. The seed layer can be omitted when used with a metal inkjet to form the data, source, and drain electrodes. In an exemplary embodiment, the data metal layer may function as a data line, a source electrode, and a drain electrode. In an exemplary embodiment of the present invention, the metal layer acts as a seed layer. The metal can be, for example, Ti, Mo, Cu or an alloy thereof.

Figure 5:
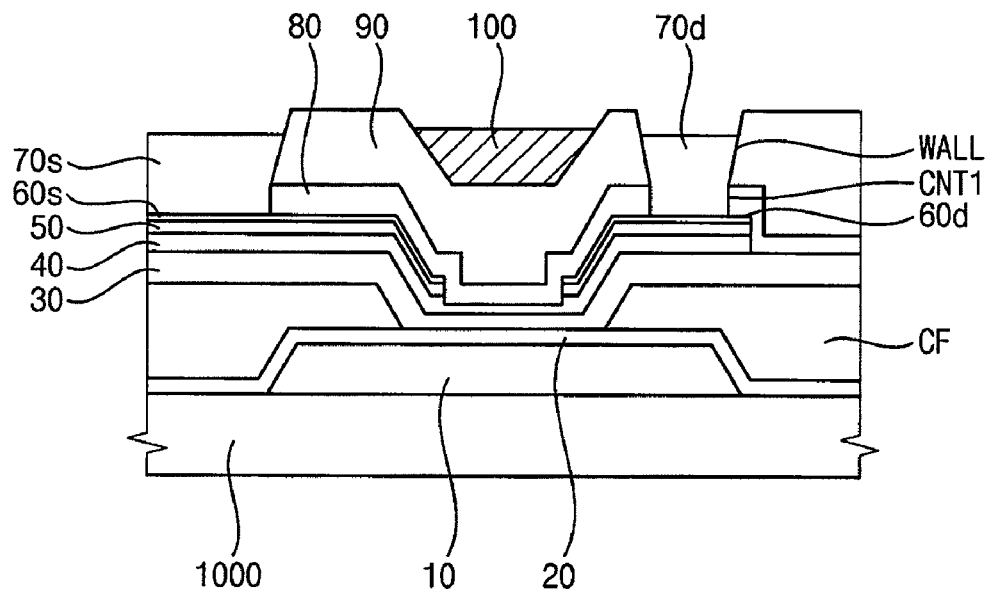
FIG. 5 is a cross sectional view of a first organic insulating layer, a thick metal layer and a black matrix formed on a substrate according to an exemplary embodiment of the present invention.

FIG. 5 is a sectional view of a TFT of the passivation layer 80 formed on the seed layer. The passivation layer 80 protects the channel area CH. After forming the passivation layer 80, the first organic insulating layer 90 is formed on the passivation layer 80. The first organic insulating layer 90 can be used to form the wall WALL in the process of the electroless plating method, the electro plating method, and the metal inkjet method. The first organic insulating layer 90 can be used to enhance the aperture ratio. The first organic insulating layer 90 reduces the parasitic capacitance between the pixel electrode 110 and the data line. The pixel electrode 110 can be extended and overlap the data line which results in enhancement of the aperture. The first organic insulating layer 90 has a contact hole in a portion corresponding to the drain electrode 70d. The organic insulating layer has the space S for accommodating the black matrix 100 on the channel area CH. To form this space, a slit mask or a halftone mask can be used. Using the slit mask, or the halftone mask, different amounts of light are exposed to the organic insulating layer, which can control the developing amount of the organic insulating layer 90. In a hole corresponding to the seed layer, and the thick metal layer is formed by the electroless plating method, the electroplating method, or a metal inkjet method. On the portion corresponding to the channel area CH, the first gate insulating layer 20 and second gate insulating layer 30 contact each other. The channel area CH is formed by the gate electrode, the semi-conductor layer, and the source-drain electrode.

Referring to FIG. 5, the first organic insulating layer (90) is formed on the passivation layer 80. The first organic insulating layer 90 is used to form the wall WALL to form the thick metal layer. This organic insulating layer has a contact hole. This contact hole may be formed with the contact hole CNT1 of the passivation layer 80 at the same time. When forming an organic insulating layer, the space S corresponding to the channel area CH and the data line may be formed to form a room to adopt the black matrix 100 in the same process. Using the first organic insulating layer 90, a pixel electrode of a pixel can be enlarged which results in a large aperture. Because the first organic insulating layer 90 decreases the parasitic capacitance between the data lines and pixel electrode, the pixel electrode can be enlarged. On the space for adopting the black matrix 100, the black matrix 100 is formed. The black matrix 100 protects the channel area CH. The second organic insulating layer 120 can be formed on the black matrix 100. The second organic insulating layer 120 prevents an out-gassing phenomenon from the black matrix 100. The material for the black matrix 100 can be organic or inorganic.

The black matrix 100 is formed on the portion proportional to the channel area CH. The black matrix 100 can be an organic material. The black matrix 100 on the TFT substrate prevents photo current in the channel area CH by blocking light. When the black matrix 100 is formed on the TFT substrate, then the black matrix 100 on the upper substrate facing the TFT substrate may be omitted. If the black matrix 100 is omitted on the upper substrate, then a margin of alignment between the TFT substrate and upper substrate increases and the aperture ratio increases.

Figure 6:
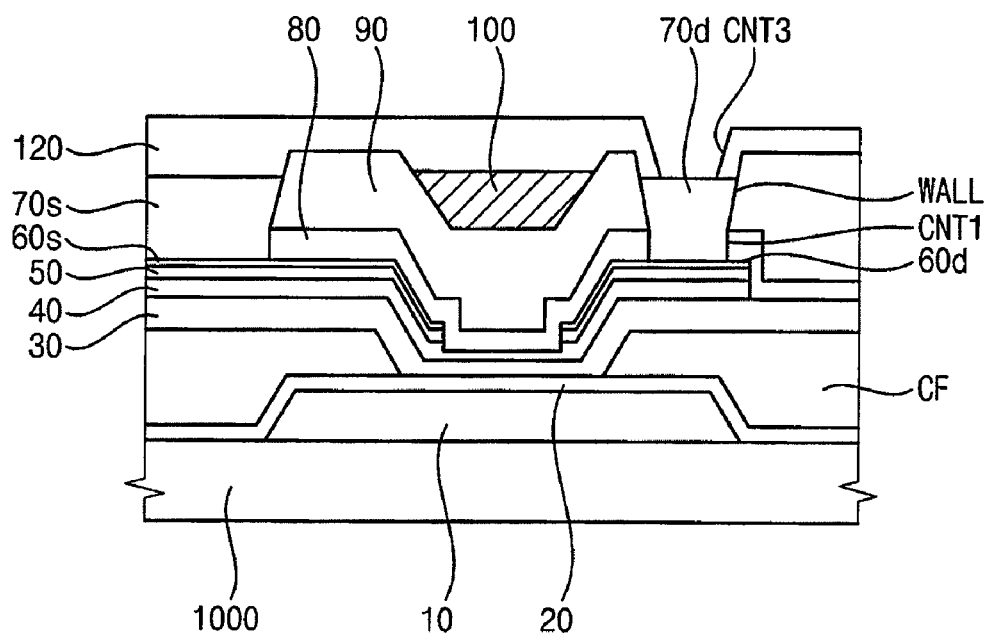
FIG. 6 is a cross sectional view of a second organic insulating layer formed on a substrate according to an exemplary embodiment of the present invention.

FIG. 6 is a sectional view of a TFT where the second organic insulating layer 120 is formed according to an exemplary embodiment of the present invention. When the black matrix 100 is exposed to the liquid crystal, the black matrix may contaminate the liquid crystal. To prevent the contamination due to the black matrix 100, the second organic insulating layer 120 may be formed. The pixel electrode 110 is formed and connected to the drain electrode 70d. Due to the first organic insulating layer 90, the pixel electrode 110 can be enlarged on a pixel boundary. An end portion of the pixel electrode 110 may overlap the data line in the pixel boundary area. This enhances the aperture ratio.

Figure 7:
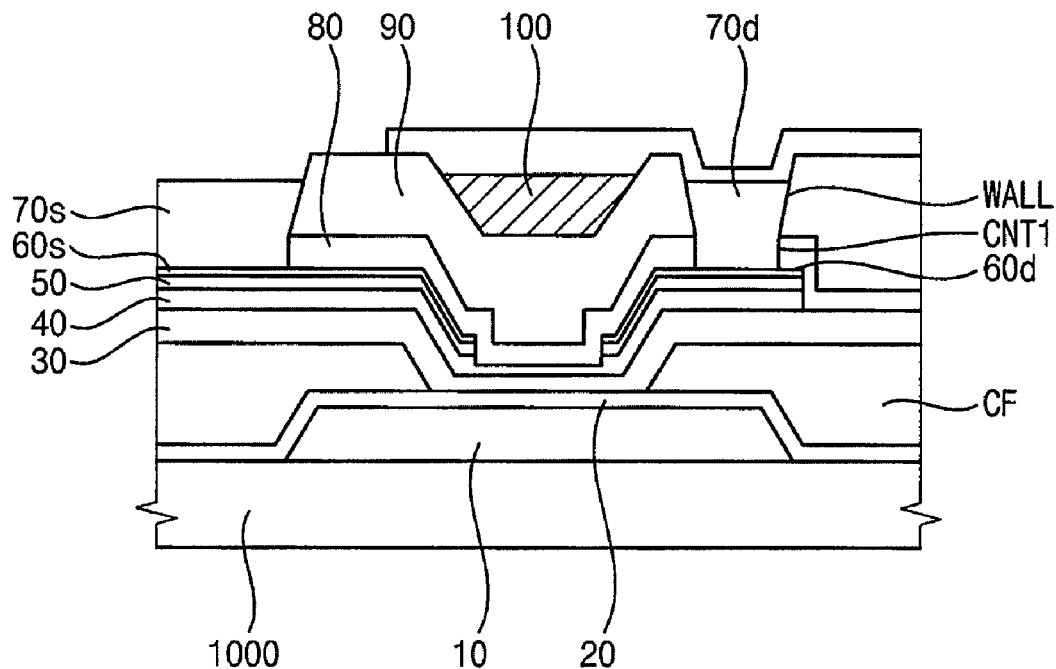
FIG. 7 is a cross sectional view of a substrate according to an exemplary embodiment of the present invention.

FIG. 7 is a sectional view of a TFT of a substrate according to an exemplary embodiment of the present invention. In an exemplary embodiment of the present invention, the first gate insulating layer 20 is formed after forming first metal gate layer including a gate line, the gate electrode 10, and a gate pad to protect the first gate metal layer from contamination by the color filter developing solution. The gate electrode 10 is formed by extending the gate lines. In an exemplary embodiment of the present invention, the second organic insulating layer 120 is not formed. The pixel electrode can be enlarged to cover the black matrix 100, and the pixel electrode overlaps the channel area CH. The distance between the pixel electrode 110 and the channel area CH is large enough not to increase parasitic capacitance due to the first gate insulating layer 20 and the black matrix 100. As such, the pixel electrode 110 can be enlarged enough to cover the black matrix 100.

Figure 8:
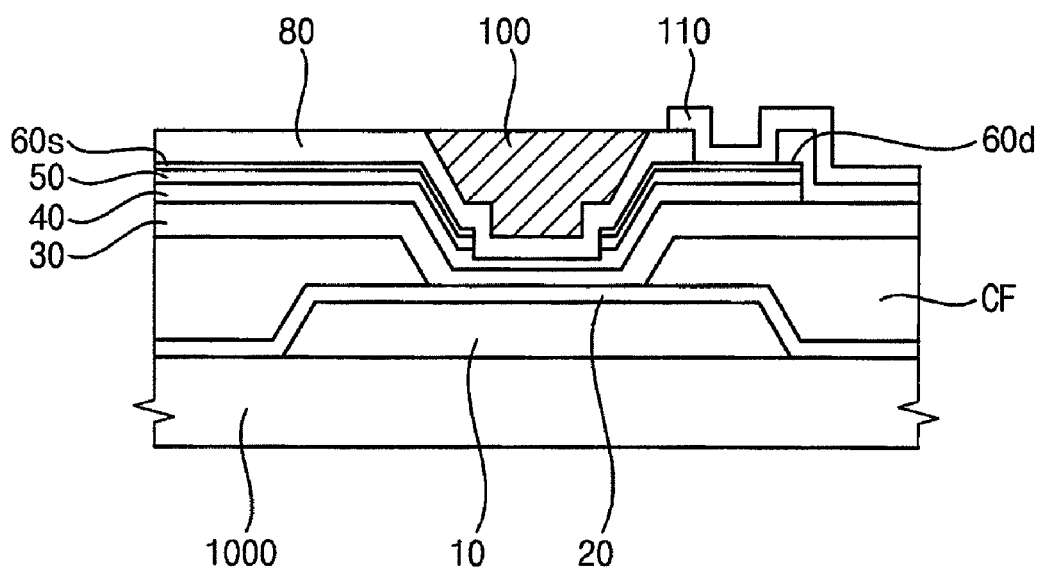
FIG. 8 is a cross sectional view of a substrate according to an exemplary embodiment of the present invention.

FIG. 8 is a sectional view of a TFT of a substrate according to an exemplary embodiment of the present invention. The first gate insulating layer 20 is formed after forming a first gate metal layer including the gate line, and the gate electrode 10 to protect the first gate metal layer from contamination by the color filter developing solution. In an exemplary embodiment of the present invention, the data metal layer is not formed by the electroless plating method or the electroplating method. As such, the first organic insulating layer 90 to form the wall WALL is not used. On the portion corresponding to the channel area CH, the black matrix (100) is formed. The metal inkjet method can be used in the process. The pixel electrode may be enlarged to cover the black matrix 100.

Figure 9:
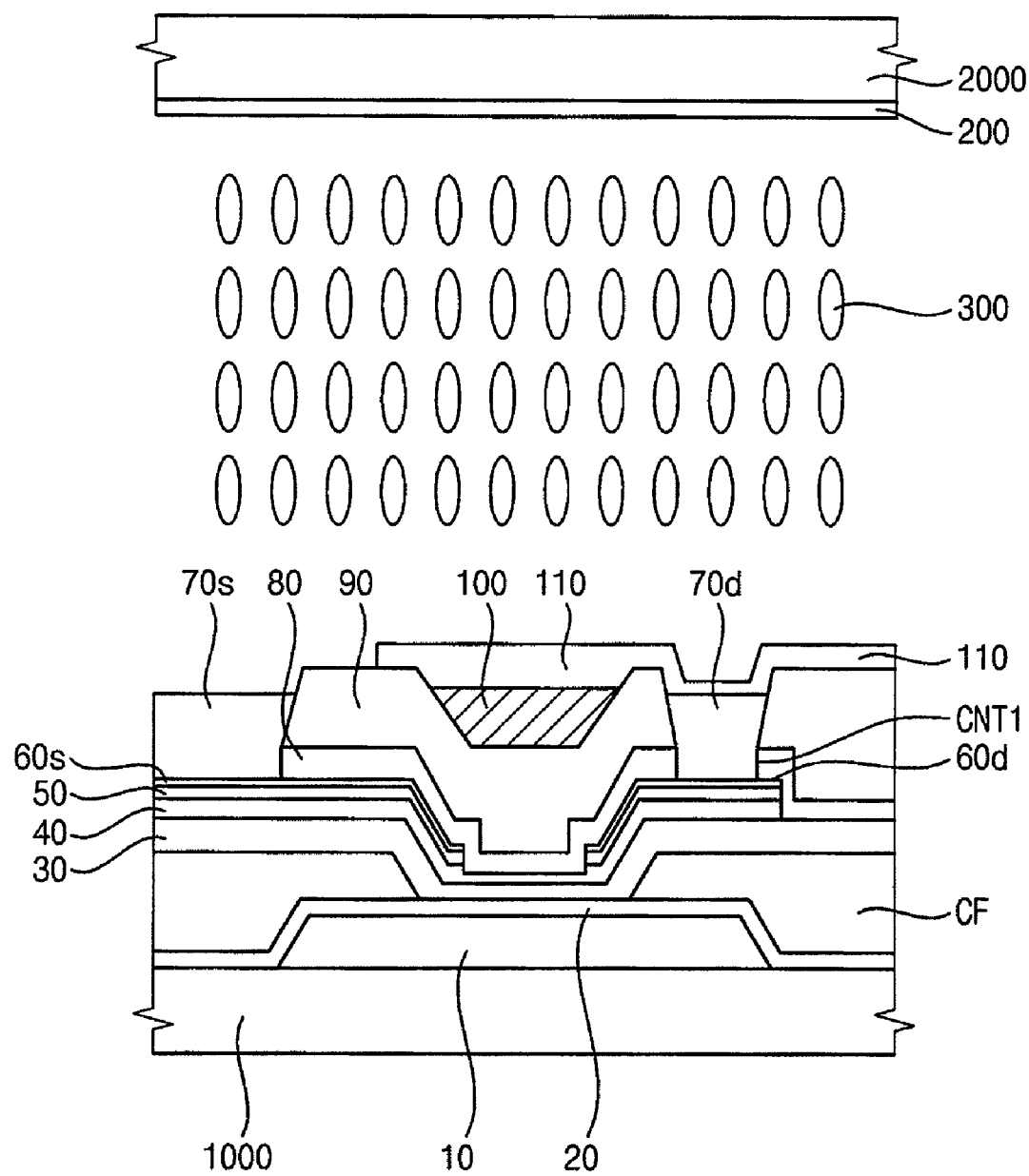
FIG. 9 is a cross sectional view of a liquid crystal display device according to an exemplary embodiment of the present invention.

FIG. 9 is a sectional view of a liquid crystal display device according to an exemplary embodiment of the present invention. The TFT substrate includes the first gate metal layer, the first gate insulating layer 20, the color filter CF, the second gate insulating layer 30, the semi-conductor pattern, the data metal layer, the passivation layer 80, and the pixel electrode 110 connected electrically to the drain electrode 70d. The black matrix (100) is formed on the portion corresponding to the channel area CH and the data line. On the upper substrate 2000, the color filter CF and the black matrix 100 can be omitted, because the color filter CF layer is formed on the TFT substrate 1000. The black matrix 100 is formed on the TFT substrate 1000, so the upper substrate 2000 includes a common electrode 200. The common electrode 200 on the upper substrate 2000 may include slits or protrusions to form multi domains of liquid crystal orientation. In an exemplary embodiment of the present invention, the color filter CF and the black matrix 100 is formed on the TFT substrate 1000, so the margin of alignment increases. That is, the pixel electrode 110 can be enlarged such that a higher aperture ratio can be achieved. The TFT substrate of the liquid crystal display device according to an exemplary embodiment of the present invention may include an organic insulating layer and a thick metal structure for the data line, a source-drain electrode and a data pad.

Figure 10:
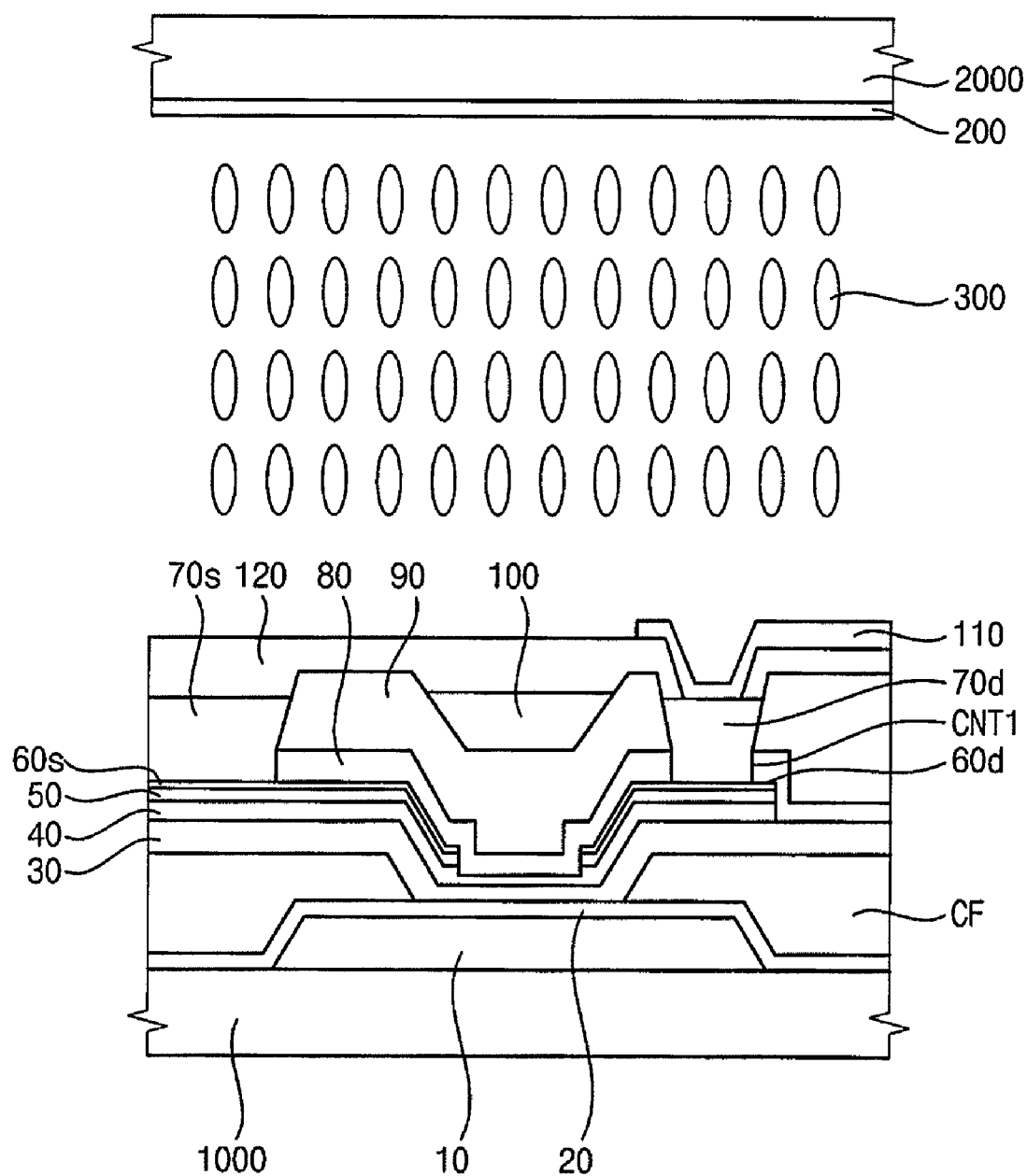
FIG. 10 is a cross sectional view of a liquid crystal display device according to an exemplary embodiment of the present invention.

FIG. 10 is a sectional view of liquid crystal display device according to an exemplary embodiment of the present invention. The TFT substrate includes the second organic insulating layer 120. The second organic insulating layer 120 protects a liquid crystal layer 300 from contamination by the black matrix 100.

Although exemplary embodiments of the present invention have been described herein with reference to the accompanying drawings, it is to be understood that the present invention should not be limited thereto and that various other changes and modifications may be affected therein by one of ordinary skill in the related art without departing from the scope or spirit of the invention. All such changes and modifications are intended to be included within the scope of the invention.

What is claimed is:

1. A thin film transistor array comprising;
   a substrate;
   a gate metal layer on the substrate, the gate metal layer comprising a gate line and
   a gate electrode;
   a first gate insulating layer covering the gate metal layer;
   a color filter on the first gate insulating layer; and
   a second gate insulating layer on the color filter.

2. The thin film transistor array of claim 1, further comprising a semi-conductor pattern on the second gate insulating layer and a data metal layer on the semi-conductor pattern, wherein the semi-conductor pattern is used to form a channel area and the data metal layer comprises a data line and a source-drain electrode.

3. The thin film transistor array of claim 2, further comprising a passivation layer on the data metal layer.

4. The thin film transistor array of claim 3, further comprising a first organic insulating layer on the passivation layer.

5. The thin film transistor array of claim 4, wherein the data metal layer comprises a seed metal layer and a thick metal layer on the seed metal layer.

6. The thin film transistor array of claim 3, further comprising a black matrix on a portion corresponding to the channel area and the data line.

7. The thin film transistor array of claim 6, further comprising a second organic insulating layer covering the black matrix.

8. The thin film transistor array of claim 7, further comprising a pixel electrode electrically connected to the drain electrode.

9. A method of manufacturing a thin film transistor array, the method comprising;
   forming a gate metal layer on a substrate;
   forming a first insulating layer on the gate metal layer;
   forming a color filter layer on the first insulating layer; and
   forming a second gate insulating layer on the color filter layer.

10. The method of claim 9, further comprising forming a semi-conductor pattern to form a channel area and a data metal layer on the substrate, wherein the data metal layer comprises a data line and a source-drain electrode.

11. The method of claim 10, further comprising forming a passivation layer on the data metal layer.

12. The method of claim 11, further comprising forming a first organic insulating layer on the passivation layer.

13. The method of claim 12, wherein forming the data metal layer comprises:
   forming a seed metal layer,
   forming an organic insulating pattern to expose the seed metal layer, and
   forming a thick metal layer on the seed metal layer.

14. The method of claim 13, wherein the thick metal layer is formed by a electroless plating method, an electrode plating method, or a metal inkjet method.

15. The method of claim 14, wherein forming the organic insulating layer pattern includes forming a space corresponding to the channel area to accommodate a black matrix.

16. The method of claim 15, further comprising forming a black matrix on a portion corresponding to a channel area and a data line.

17. The method of claim 16, wherein the black matrix comprises an organic material.

18. The method of claim 17, wherein the black matrix is formed by a metal inkjet method.

19. A thin film transistor array substrate comprising;
   a gate electrode on a substrate;
   a first gate insulating layer on the gate electrode;
   a color filter on the first gate insulating layer, wherein the color filter corresponds to an edge portion of the gate electrode;
   a second gate insulating layer on the color filter; and
   a semiconductor pattern on the second gate insulating layer, wherein the semiconductor pattern is used to form a channel area and the first gate insulating layer and the second gate insulating layer contact each other on a portion corresponding to the channel area.

20. The thin film transistor of claim 19, wherein the first gate insulating layer and the second gate insulating layer contact each other directly.

21. A liquid crystal display device comprising;
   a first substrate;
   a second substrate facing the first substrate;
   a liquid crystal layer between the first and the second substrates;
   a gate metal layer on the second substrate, wherein the gate metal layer includes a gate line and a gate electrode;
   a first gate insulating layer covering the gate metal layer;
   a color filter on the first insulating layer; and
   a second gate insulating layer on the color filter.

* * * * *